(12) United States Patent
Hsieh

(10) Patent No.: US 12,265,106 B2
(45) Date of Patent: Apr. 1, 2025

(54) POWER CONTROL SYSTEM AND METHOD FOR MOTOR PREHEATING

(71) Applicant: Delta Electronics, Inc., Taoyuan (TW)

(72) Inventor: Chung-An Hsieh, Taoyuan (TW)

(73) Assignee: Delta Electronics, Inc., Taoyuan (TW)

(*) Notice: Subject to any disclaimer, the term of this patent is extended or adjusted under 35 U.S.C. 154(b) by 178 days.

(21) Appl. No.: 18/117,533

(22) Filed: Mar. 6, 2023

(65) Prior Publication Data

US 2024/0125829 A1 Apr. 18, 2024

(30) Foreign Application Priority Data

Oct. 14, 2022 (CN) .......................... 202211263067.5

(51) Int. Cl.
*G01R 21/02* (2006.01)
*G01R 21/06* (2006.01)

(52) U.S. Cl.
CPC ............. *G01R 21/02* (2013.01); *G01R 21/06* (2013.01)

(58) Field of Classification Search
CPC ........ G01R 21/02; G01R 21/06; G01R 21/00; G01R 31/343; H02P 29/64
See application file for complete search history.

(56) References Cited

U.S. PATENT DOCUMENTS

| | | | | |
|---|---|---|---|---|
| 2006/0250154 A1* | 11/2006 | Gao | ....................... | H02H 6/005 324/765.01 |
| 2015/0266466 A1* | 9/2015 | Johri | .................. | B60W 30/188 180/65.265 |
| 2016/0181966 A1* | 6/2016 | Donolo | ................ | H02H 7/0805 318/434 |
| 2017/0154283 A1* | 6/2017 | Kawai | ................... | G06F 11/006 |
| 2021/0297034 A1 | 9/2021 | Colby | | |

FOREIGN PATENT DOCUMENTS

| | | |
|---|---|---|
| CN | 1171115 C | 10/2004 |
| CN | 101841300 A | 9/2010 |
| CN | 105874670 A | 8/2016 |
| CN | 106487316 A | 3/2017 |
| CN | 109104113 A | 12/2018 |
| CN | 109217776 A | 1/2019 |
| CN | 113452300 A | 9/2021 |
| TW | M274555 U | 9/2005 |
| TW | 202137661 A | 10/2021 |

* cited by examiner

*Primary Examiner* — Akm Zakaria
(74) *Attorney, Agent, or Firm* — KIRTON McCONKIE; Evan R. Witt

(57) ABSTRACT

The present disclosure provides a power control system for motor preheating including a current sensor, a power calculation module, a power error calculation module, a power control module, a current control module and a voltage control module. The current sensor senses a motor current output by the motor. The power calculation module calculates an output power of the motor according to the voltage command and the motor current. The power error calculation module calculates a power error according to a power command and the output power. The power control module outputs a current braking command according to the power error. The current control module calculates a voltage command according to the current braking command and the motor current. The voltage control module outputs a three-phase voltage according to the voltage command, and the motor is operated in a stationary state, and the stator of the motor is preheated.

10 Claims, 6 Drawing Sheets

POWER CONTROL SYSTEM AND METHOD FOR MOTOR PREHEATING

CROSS-REFERENCE TO RELATED APPLICATION

This application claims priority to China Patent Application No. 202211263067.5, filed on Oct. 14, 2022, the entire contents of which are incorporated herein by reference for all purposes.

FIELD OF THE INVENTION

The present disclosure relates to a power control system and method for motor preheating, and more particularly to a power control system and method which adjusts the current braking command according to the power command and the output power for motor preheating.

BACKGROUND OF THE INVENTION

In the conventional preheating system for motor stator, the current command is input to the current loop and is calculated to output the voltage command. The pulse-width modulation module injects the DC current corresponding to the voltage command into the motor, so the stator winding generates heat energy. Therefore, the defrosting and rust-proof are performed on the components of the motor, such as the coil or the casing.

However, the above-mentioned current command of the preheating system is a fixed preset value which would not change corresponding to the variation of the actual output power of the motor. Therefore, in the conventional preheating system, a power measurement equipment is usually disposed additionally for measuring the output power, and the current command is calibrated and adjusted correspondingly. However, the above-mentioned calibration method takes time, and if the preheating current command is obtained by the calibration with a power measurement device, the resistance value may also change due to the thermal effect of the resistance, thereby affecting the accuracy of measuring the output power. In addition, the conventional three-phase power calculation method cannot obtain the actual output power of the motor.

Therefore, there is a need of providing a power control system and method for motor preheating to obviate the drawbacks encountered from the prior arts.

SUMMARY OF THE INVENTION

It is an object of the present disclosure to provide a power control system and method for motor preheating. In this power control system and method, a current braking command is output and adjusted according to a power error between an output power of a motor and a power command. The motor is preheated by receiving a three-phase voltage corresponding to the current braking command, thereby improving the accuracy of the output power of the motor.

It is another object of the present disclosure to provide a power control system and method for motor preheating. In this power control system and method, a power calculation module calculates the output power of the motor receiving a three-phase current. Therefore, the calculated output power is not affected by the resistance thermal effect of the motor and is equivalent to an actual output electrical power value of the motor. Since the output power of the motor is calculated according to the known voltage command and the motor current sensed during the operation of the motor, no additional power measurement equipment is required for measuring the output power of the motor.

In accordance with an aspect of the present disclosure, there is provided a power control system for motor preheating. The power control system for motor preheating includes a motor, a current sensor, a power calculation module, a power error calculation module, a power control module, a current control module and a voltage control module. The motor receives a three-phase voltage to operate. The current sensor is electrically connected to the motor. The current sensor senses the motor current output by the motor during operation. The power calculation module is electrically connected to the current control module and the current sensor, the power calculation module calculates the output power of the motor during operation according to the voltage command and the motor current. The power error calculation module is electrically connected to the power calculation module, the power error calculation module receives the output power and a power command, and calculates the power error according to the power command and the output power. The power control module is electrically connected to the power error calculation module, the power control module receives the power error and outputs a current braking command according to the power error. The current braking command is between an upper limit value and a lower limit value. If the power error received by the power control module within a period of time continues to be positive, the slope of the variation of the current braking command output by the power control module during this period corresponds to a positive value. If the power error received by the power control module within a period of time continues to be negative, the slope of the variation of the current braking command output by the power control module during this period corresponds to a negative value. If the power error received by the power control module within a period of time continues to be zero, the output current braking command of the power control module during this period is not adjusted. The current control module is electrically connected to the power control module and the current sensor, the current control module receives the current braking command from the power control module and receives the motor current from the current sensor, and the current control module calculates the voltage command according to the current braking command and the motor current. The voltage control module is electrically connected to the current control module and the motor. The voltage control module receives the voltage command from the current control module and outputs the three-phase voltage according to the voltage command, so the motor is operated in a stationary state and the stator of the motor is preheated.

In accordance with an aspect of the present disclosure, there is provided a power control method for motor preheating. The power control method includes steps of: (a) providing a power command; (b) providing a three-phase voltage for controlling the operation of the motor; (c) sensing a motor current output by the motor during operation by a current sensor; (d) calculating an output power during the operation of the motor according to a voltage command and the motor current by a power calculation module; (e) calculating a power error according to the power command and the output power by a power error calculation module; (f) outputting a current braking command according to the power error by a power control module; (g) outputting the voltage command according to the current braking command by a current control module; (h) outputting the three-phase voltage to the motor according to the voltage command by a voltage control module; and (i) controlling the motor to operate in a stationary state and preheating a stator of the motor, and the step (b) is performed again. In the step (f), the current braking command is between an upper limit value and a lower limit value, and the step (f) includes steps of: (f1) outputting the positive slope of the variation of the output current braking command during a period of time by the power control module if the power error received by the power control module within the period of time continues to be positive; (f2) outputting the negative slope of the variation of the output current braking command during a period of time by the power control module if the power error received by the power control module within the period of time continues to be negative; or (f3) without adjusting the output current braking command of the power control module during a period of time if the power error received by the power control module within the period of time continues to be zero.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
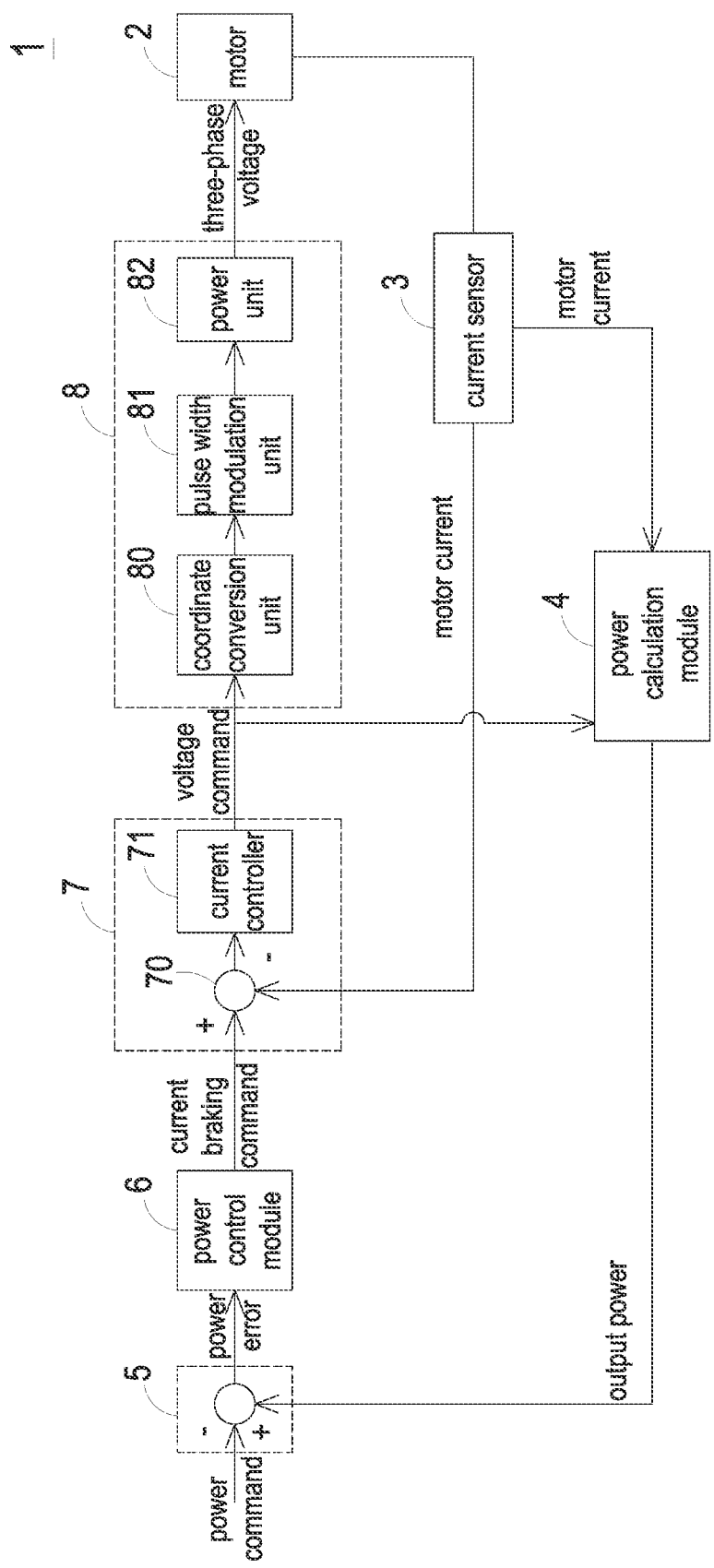
FIG. 1 is a schematic block diagram illustrating a power control system for motor preheating according to an embodiment of the present disclosure.

FIG. 1 is a schematic block diagram illustrating a power control system 1 for motor preheating according to an embodiment of the present disclosure. As shown in FIG. 1, the power control system 1 for motor preheating includes a motor 2, a current sensor 3, a power calculation module 4, a power error calculation module 5, a power control module 6, a current control module 7 and a voltage control module 8. The motor 2 receives a three-phase voltage to operate. The motor 2 is for example but not limited to a DC motor or an AC motor. In an embodiment, the operation of the motor 2 represents that the motor 2 receives a three-phase voltage to rotate. The current sensor 3 is electrically connected to the motor 2. The current sensor 3 is configured for sensing the motor current output by the motor 2 during operation. The power calculation module 4 is electrically connected to the current control module 7 and the current sensor 3. The power calculation module 4 calculates the output power of the motor 2 during operation according to the voltage command output by the current control module 7 and the motor current. The power error calculation module 5 is electrically connected to the power calculation module 4, the power error calculation module 5 receives the output power and a power command, and calculates the power error according to the power command and the output power. The power command is for example but not limited to a target power required for the motor 2 to heat up, and the power command is input to the power control system 1 for motor preheating by a user.

The power control module 6 is electrically connected to the power error calculation module 5. The power control module 6 receives the power error and outputs a current braking command according to the power error, and the power control module 6 controls the current braking command between an upper limit value and a lower limit value. If the power error received by the power control module 6 within a period of time continues to be positive, the slope of the variation of the current braking command output by the power control module 6 during this period of time corresponds to a positive value. On the contrary, if the power error received by the power control module 6 within a period of time continues to be negative, the slope of the variation of the current braking command output by the power control module 6 during this period of time corresponds to a negative value. In an embodiment, the positive and the negative slopes have the same absolute value. In specific, the current braking commands corresponding to the positive and the negative slopes have different directions of variation but the same variation amplitude. If the power error received by the power control module 6 within a period of time continues to be zero, that is, the output power is equal to the power command, the output current braking command of the power control module 6 during this period of time is not adjusted, that is, no need to adjust the output power.

The current control module 7 is electrically connected to the power control module 6 and the current sensor 3. The current control module 7 receives the current braking command from the power control module 6 and receives the motor current from the current sensor 3, and the current control module 7 calculates the voltage command according to the current braking command and the motor current. In an embodiment, the current control module 7 includes a calculation unit 70 and a current controller 71. The current control module 7 performs an addition or subtraction operation on the current braking command and the motor current through the calculation unit 70, and the current control module 7 outputs the voltage command through the current controller 71 according to the operation result. The voltage control module 8 is electrically connected to the current control module 7 and the motor 2. The voltage control module 8 receives the voltage command from the current control module 7 and outputs the three-phase voltage to the motor 2 according to the voltage command, so the motor 2 is operated in a stationary state and the stator (not shown) of the motor 2 is preheated due to the copper loss. In an embodiment, the motor 2 operates in a stationary state means that the motor 2 does not have rotational kinetic energy or AC component energy, so the iron losses (such as hysteresis loss or eddy current loss) can be ignored. The output power of the motor 2 is regarded as the heat energy used for the preheating of the stator of the motor 2.

In the power control system for motor preheating of the present disclosure, the current braking command is output and adjusted according to the power error between the output power of the motor and the power command. The motor is preheated by receiving the three-phase voltage corresponding to the current braking command, thereby improving the accuracy of the output power of the motor.

In an embodiment, the voltage control module 8 further includes a coordinate conversion unit 80, a pulse width modulation unit 81 and a power unit 82 that are electrically connected to each other. The coordinate conversion unit 80 and the pulse width modulation module 81 respectively perform 0-degree electrical angle coordinate vector output and the pulse width modulation on the components of the three phases of the voltage command to obtain a three-phase voltage, and the three-phase voltage is output to the three-phase stator windings of the motor 2 through the switching of the power unit 82.

Figure 2:
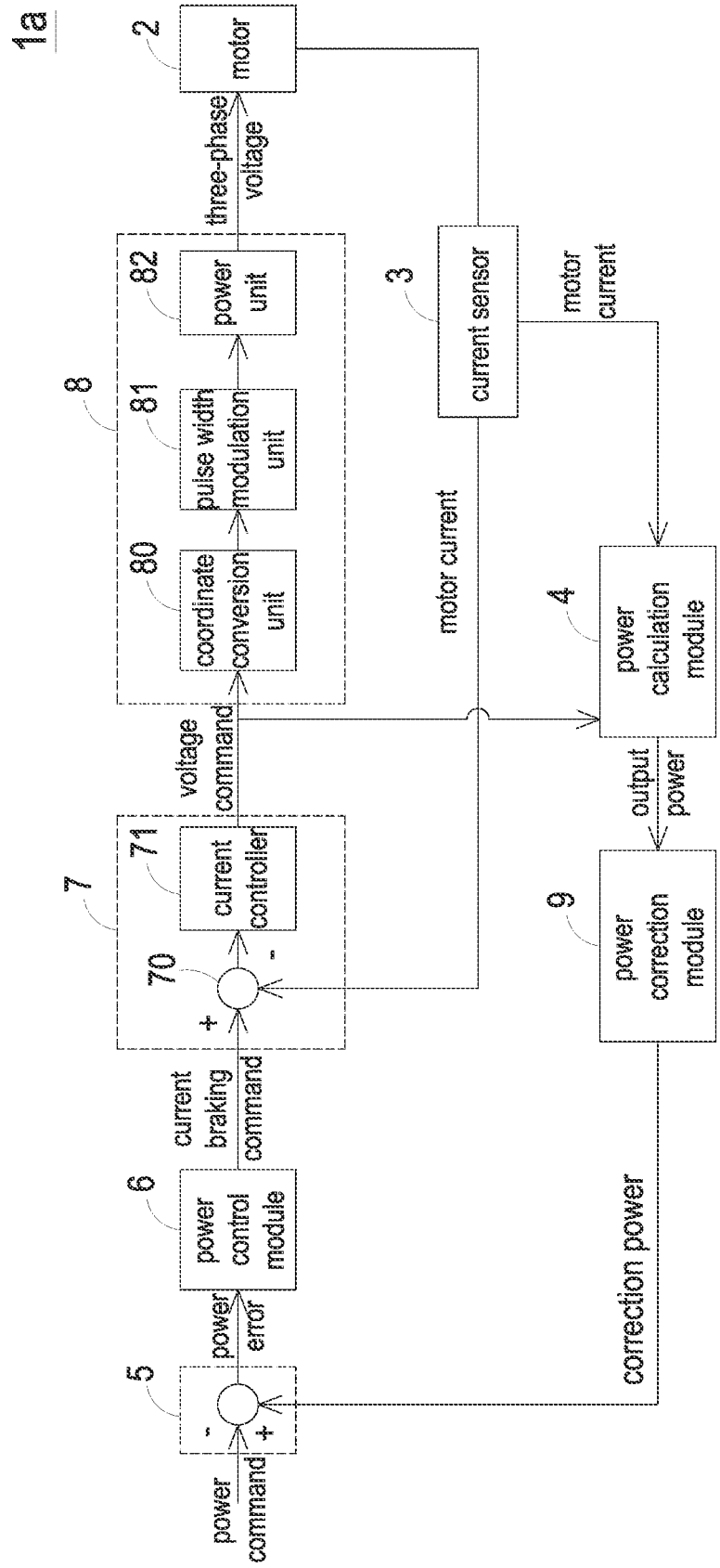
FIG. 2 is a schematic block diagram illustrating a power control system for motor preheating according to another embodiment of the present disclosure.

In an embodiment, the output power calculated by the power control module 6 is corrected and then input to the power error calculation module 5. As shown in FIG. 2, which is a schematic block diagram illustrating a power control system 1a for motor preheating according to another embodiment of the present disclosure. The elements of FIG. 2 that are similar with those of FIG. 1 are represented by the same reference numerals, and the detailed description thereof is omitted herein. The power control system 1a for motor preheating of the present disclosure further includes a power correction module 9 electrically connected between the power calculation module 4 and the power error calculation module 5. The power correction module 9 corrects the output power to a correction power, and the power error calculation module 5 receives the correction power and the power command and calculates the power error according to the power command and the correction power. In an embodiment, the power correction module 9 corrects the output power to the correction power through multiplying the output power by a correction coefficient. By correcting the output power, the output power of the inverter can be closer to the power command actually measured by the external instrument, so as to reduce the situation that the calculated output power is inaccurate due to the measurement error of the control system. Specifically, please refer to Table 1 below, in case 1, the power command of the inverter is 1000 W, but the actual power measurement value measured by the instrument is 900 W during machine calibration, which means that the actual output power of the motor 2 is less than the command value. At this time, the power correction coefficient can be set to 0.9 (i.e., 900 W/1000 W), so the inverter regards that the current calculating power is less than the power command actually measured by the external instrument. Because the accuracy of the external instrument is usually better, so the power output by the inverter is corrected upwardly to be higher to meet the actual power command. In case 2, if the power command of the inverter is 500 W, but the actual power measurement value measured by the instrument is 700 W during machine calibration, which means that the actual output power of the motor 2 is greater than the command value. At this time, the power correction coefficient can be set to 1.4 (i.e., 700 W/500 W), so the inverter regards that the current calculating power is greater than the power command actually measured by the external instrument. The power output by the inverter is corrected downwardly to be lower to meet the actual power command. In the above cases, the power correction coefficient is equal to the actual power measurement value divided by the power command.

TABLE 1

Selection of the power correction coefficient.

| | power command of the inverter | actual power measurement value | power correction coefficient |
|---|---|---|---|
| Case 1 | 1000 W | 900 W | 0.9 |
| Case 2 | 500 W | 700 W | 1.4 |

Figure 3:
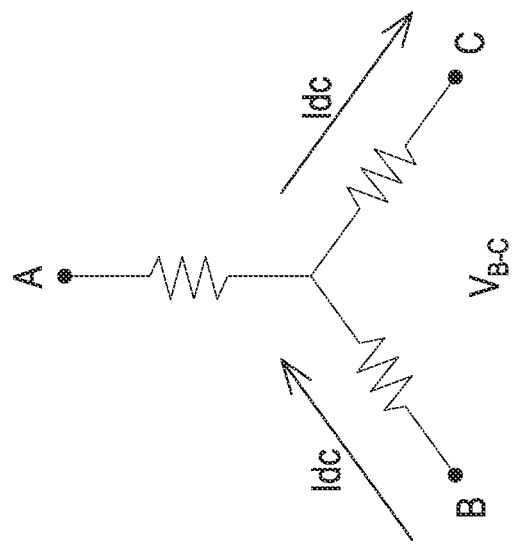
FIG. 3 is a schematic circuit diagram illustrating the output power of the motor calculated by the power calculation module of FIG. 1.

The method and details of the power calculation module 4 calculating the output power are described as follows. FIG. 3 is a schematic circuit diagram illustrating the output power of the motor 2 calculated by the power calculation module 4 of FIG. 1. In this embodiment, the power calculation module 4 calculates the output power of the motor 2 receiving a three-phase current. The terminals of the three-phase circuit shown in FIG. 3 are A, B and C respectively. The currents flow through terminals A, B and C correspond to IA, IB and IC, respectively. It should be noted that, when the power calculation module 4 performs current braking at the 0° angular coordinate vector, two phases of the three-phase circuit are turned on, and the amplitudes of the currents flowing through these two phases are the same. In the embodiment shown in FIG. 3, the terminals B and C are turned on, and the output power Pdc satisfies the following formula (1):

$$Pdc = V_{B-C} * Idc \quad (1)$$

The current Idc is the average of the absolute values of the currents IB and IC respectively. The amplitudes of IB and IC are the same, and the directions of IB and IC are opposite. The voltage $V_{B-C}$ is the voltage difference between the terminals B and C. The power calculation module 4 in the present disclosure calculates the output power of the motor 2 receiving a three-phase current, so the calculated output power is not affected by the resistance thermal effect of the motor 2, and can be equivalent to the actual output electrical power value of the motor 2. In addition, since the output power of the motor 2 can be obtained by calculation, no additional power measurement equipment is required for measuring the output power of the motor 2, and the cost of constructing the system construction is saved and the calculation speed is improved.

Figure 4:
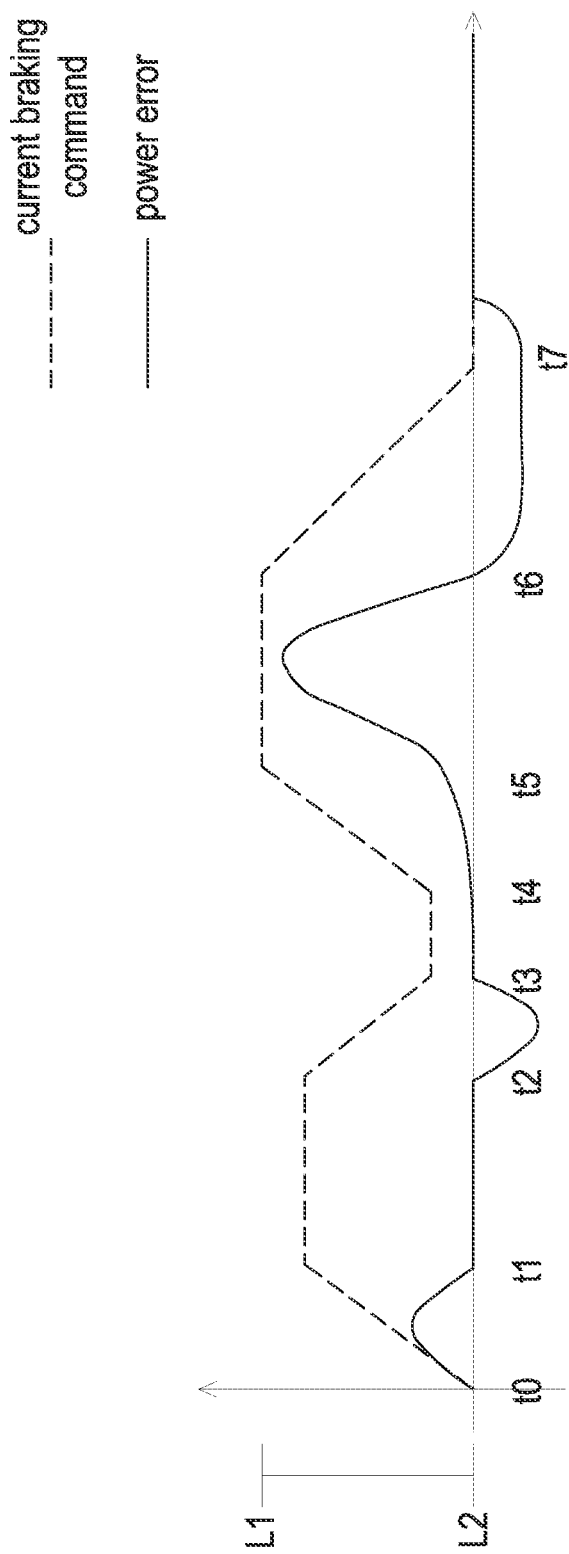
FIG. 4 schematically shows the waveforms of the power control module of FIG. 1.

The method and details of the power control module 6 outputting the current braking command according to the power error are explained with the waveform diagram shown in FIG. 4 as follows. As shown in FIG. 4, the power control module 6 controls the value of the current braking command between an upper limit value L1 and a lower limit value L2. In an embodiment, the upper limit value L1 is the rated current upper limit of the motor 2, and the lower limit value L2 is zero. During time period t0 to t1, the power error received by the power control module 6 continues to be positive, so the power control module 6 outputs the current braking command with a variation slope A during time period t0 to t1 continuously, wherein value of the slope A is positive. During time period t1 to t2, the power error received by the power control module 6 continues to be zero, that is, during this time period, the output power is equal to the power command, so the power control module 6 outputs the current braking command with a variation slope of zero during time period t1 to t2. In this circumstance, the adjustment for the current braking command is not required. The situation during the period from time period t3 to t4 in FIG. 4 is similar to that from time period t1 to t2, and the detailed descriptions thereof are omitted herein. During time period t2 to t3, the power error received by the power control module 6 continues to be negative, so the power control module 6 outputs the current braking command with a variation slope B during time period t2 to t3 continuously, wherein value of the slope B is negative. In an embodiment, the absolute values of the slope A and slope B are equal. In specific, the current braking commands corresponding to the positive and the negative slopes have the same variation amplitude but different directions of variations. The slope A represents upward following adjustment, and the slope B represents downward following adjustment. In an embodiment, the absolute values of the slope A and the slope B are for example but not limited to 1 pu/ms, where pu is the smallest resolvable unit of the motor current of the motor 2. By setting the slope as the smallest resolvable unit of the motor current of the motor 2, the distortion of the power calculation caused by the inaccuracy of the measurement of the current sensor 3 is avoided. In conclusion, when the power error received by the power control module 6 changes, the power control module 6 adjusts the current braking command according to a fixed slope of variation so that the adjusted output power is corrected upwardly or downwardly toward the target value of the power command. As shown in FIG. 4, the power control module 6 adjusts the current braking command continuously, and corrects the current braking command upwardly or downwardly according to the deviation direction of the current output power relative to the target value of the power command, so as to output different current braking commands. Through outputting different current braking commands, the current braking command is iteratively corrected until the power error equals zero.

Figure 5:
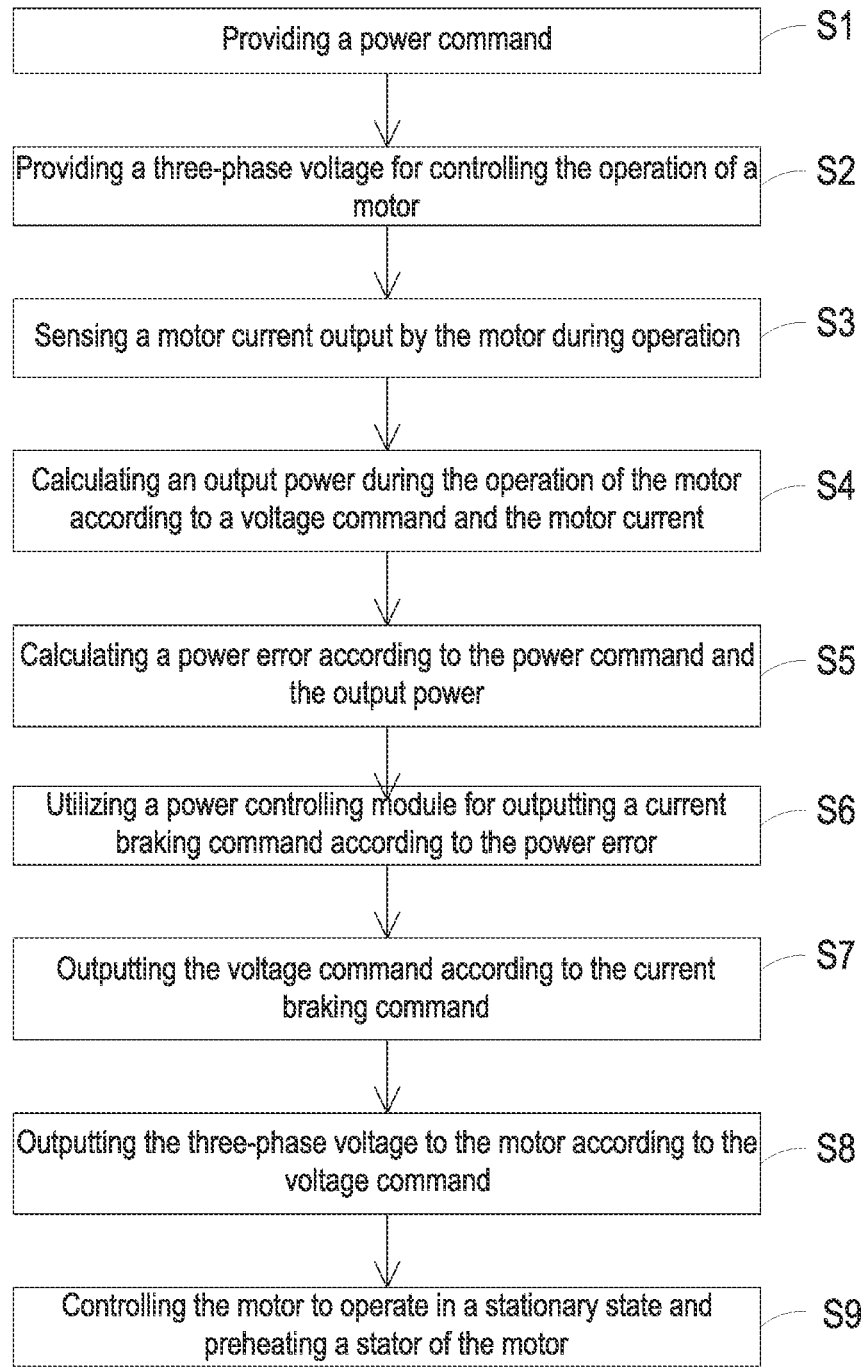
FIG. 5 is a schematic flow chart illustrating a power control method for motor preheating according to an embodiment of the present disclosure.

FIG. 5 is a schematic flow chart illustrating a power control method for motor preheating according to an embodiment of the present disclosure. The power control method for motor preheating of the present disclosure is applicable for the power control systems 1 and 1a stated above. As shown in FIG. 5, the power control method for motor preheating includes steps S1, S2, S3, S4, S5, S6, S7, S8 and S9. In the step S1, the power command is provided as a preheat target, that is, the power control systems 1 and 1a are informed the target value of the power command required to preheat the motor 2. In the step S2, the three-phase voltage corresponding to the power command is provided for controlling the operation of the motor 2. In the step S3, the motor current output by the motor 2 during operation is sensed by the current sensor 3. In the step S4, the output power during the operation of the motor 2 is calculated according to the voltage command and the motor current by the power calculation module 4. In the step S5, the power error is calculated according to the power command and the output power by the power error calculation module 5. In the step S6, the current braking command is output by the power control module 6 according to the power error. In the step S7, the voltage command is output according to the current braking command and the motor current by the current control module 7. In the step S8, the three-phase voltage is output to the motor 2 according to the voltage command by the voltage control module 8, so the output power of the motor 2 during operation is adjusted. In the step S9, the motor 2 is controlled to operate in a stationary state, and the stator of the motor 2 is preheated due to the copper loss, and the step S2 is performed again until the preheat target is reached.

Figure 6:
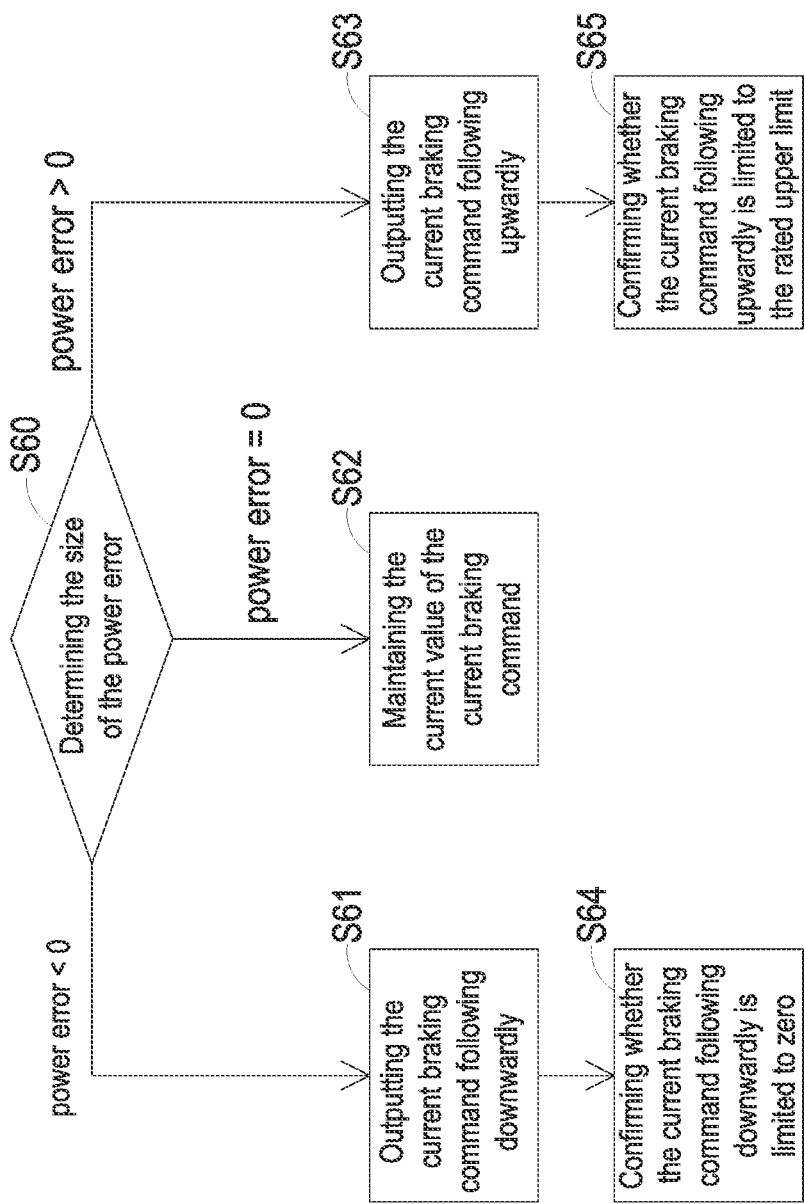
FIG. 6 is a schematic flow chart illustrating the step S6 of the power control method of FIG. 5 in detail.

FIG. 6 is a schematic flow chart illustrating the step S6 of the power control method of FIG. 5 in detail. Please refer to FIGS. 5 and 6, the step S6 of the power control method of the present disclosure further includes steps of S60, S61, S62, S63, S64 and S65. In the step S60, the size of the power error is determined. When the power error is less than zero, it represents that the power command is less than the output power, so the step S61 is performed to adjust and output the current braking command following downwardly to reduce the output power. When the power error is equal to zero, it represents that the power command is equal to the output power, so the step S62 is performed, that is, the output power does not need to be adjusted, and the value of the current braking command is maintained. When the power error is greater than zero, it represents that the power command is greater than the output power, so the step S63 is performed to adjust and output the current braking command following upwardly to increase the output power. In the step S61, the current braking command following downwardly is output, and the step S7 is performed after the adjusted current braking command is output. In the step S62, the current braking command is maintained and the step S7 is performed. In the step S63, the current braking command following upwardly is output, and the step S7 is performed after the adjusted current braking command is output. In an embodiment, the step S64 is performed after performing the step S61, in the step S64, whether the current braking command following downwardly is limited to zero (lower limit) is confirmed. In an embodiment, the step S65 is performed after performing the step S63, in the step S65, whether the current braking command following upwardly is limited to the rated upper limit is confirmed.

In the step S6, the power controlling module 6 controls the current braking command between an upper limit value L1 and a lower limit value L2. If the power error received by the power control module 6 continues to be positive in a period of time, the variation slope of the output current braking command of the power control module 6 during this period of time corresponds to a positive value, that is, the output power is corrected upwardly. If the power error received by the power control module 6 continues to be negative in a period of time, the variation slope of the output current braking command of the power control module 6 during this period of time corresponds to a negative value, that is, the output power is corrected downwardly. If the power error received by the power control module 6 continues to be zero in a period of time, the output power is maintained and without correction. In the time period t4 to t5 shown in FIG. 4, the power error received by the power control module 6 continues to be positive, so the power control module 6 outputs the current braking command with a variation slope A during time period t4 to t5 continuously, wherein value of the slope A is positive. In the process of continuously correcting the output power upwardly, for example, at time t5, the current braking command being too large may be happened. In this circumstance, the output current braking command is limited to the upper limit value L1. The upper limit value L1 is for example but not limited to the upper limit value of the rated current of the motor 2, thereby protecting the motor 2. Moreover, during time period t5 to t6, the power error received by the power control module 6 continues to be positive, so the power control module 6 continues to limit the output current braking command to the upper limit value L1. During time period t6 to t7, the power error received by the power control module 6 continues to be negative, so the power control module 6 outputs the current braking command with a variation slope B during time period t6 to t7 continuously, wherein value of the slope B is negative. In the process of continuously correcting the output power downwardly, for example, at time t7, the current braking command becomes a negative value, that is, the current braking command is less than zero. In this circumstance, the output current braking command is limited to the lower limit value L2. In this embodiment, the lower limit value L2 is zero, it means that the output power of the system is low enough, so the current braking command is no longer output for reducing the output power of the motor 2.

In an embodiment, the step S4 further includes a step of: correcting the output power to a correction power by the power correction module 9. The step S5 further includes a step of: calculating the power error according to the power command and the correction power by the power error calculation module 5. In an embodiment, the power correction coefficient is equal to the actual power measurement value divided by the power command.

From the above descriptions, the present disclosure provides a power control system and power control method for motor preheating, the current braking command is output and adjusted according to the power error between the output power of the motor and the power command. The motor is preheated by receiving the three-phase voltage corresponding to the current braking command, thereby improving the accuracy of the output power of the motor. In addition, the power calculation module of the present disclosure calculates the output power of the motor receiving a three-phase current. Therefore, the calculated output power is not affected by the resistance thermal effect of the motor and is equivalent to the actual output electrical power value of the motor. Since the output power of the motor is calculated according to the known voltage command and the motor current sensed during the operation of the motor, no additional power measurement equipment is required for measuring the output power of the motor.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power control system for motor preheating, comprising:
   a motor receiving a three-phase voltage to operate;
   a current sensor electrically connected to the motor, wherein the current sensor senses a motor current outputted by the motor during an operation of the motor;
   a power calculation module electrically connected to the current sensor, wherein the power calculation module calculates an output power of the motor during operation according to a voltage command and the motor current;
   a power error calculation module electrically connected to the power calculation module, wherein the power error calculation module receives the output power and a power command and calculates a power error according to the power command and the output power;
   a power control module electrically connected to the power error calculation module, wherein the power control module receives the power error and outputs a current braking command according to the power error, wherein the current braking command is between an upper limit value and a lower limit value, if the power error received by the power control module within a first period of time continues to be positive, a first slope of a variation of the current braking command output by the power control module during the first period of time corresponds to a positive value, if the power error received by the power control module within a second period of time continues to be negative, a second slope of the variation of the current braking command output by the power control module during the second period of time corresponds to a negative value, if the power error received by the power control module within a third period of time continues to be zero, the output current braking command of the power control module during the third period of time is not adjusted;
   a current control module electrically connected to the power control module, the power calculation module and the current sensor, wherein the current control module receives the current braking command from the power control module and receives the motor current from the current sensor, and the current control module calculates the voltage command according to the current braking command and the motor current; and
   a voltage control module electrically connected to the current control module and the motor, wherein the voltage control module receives the voltage command from the current control module and outputs the three-phase voltage according to the voltage command, and the motor is operated in a stationary state and a stator of the motor is preheated.

2. The power control system according to claim 1, further comprising a power correction module electrically connected between the power calculation module and the power error calculation module, wherein the power correction module corrects the output power to a correction power, and the power error calculation module receives the correction power and the power command, and the power error calculation module calculates the power error according to the power command and the correction power.

3. The power control system according to claim 2, wherein the power correction module corrects the output power to the correction power through multiplying the output power by a correction coefficient, and the correction coefficient is a value of the actual power measurement divided by a value of the power command.

4. The power control system according to claim 1, wherein absolute values of the first and second slopes of the variations of the output current braking command output by the power control module are the same.

5. The power control system according to claim 1, wherein the power calculation module calculates the output power of the motor receiving a three-phase current.

6. A power control method for motor preheating, comprising steps of:
   (a) providing a power command;
   (b) providing a three-phase voltage for controlling the operation of a motor;
   (c) sensing a motor current outputted by the motor during operation by a current sensor;
   (d) calculating an output power during the operation of the motor according to a voltage command and the motor current by a power calculation module;
   (e) calculating a power error according to the power command and the output power by a power error calculation module;
   (f) outputting a current braking command according to the power error by a power control module;

(g) outputting the voltage command according to the current braking command by a current control module;

(h) outputting the three-phase voltage to the motor according to the voltage command by a voltage control module; and (i) controlling the motor to operate in a stationary state and preheating a stator of the motor, and the step (b) is performed again, wherein in the step (f), the current braking command is between an upper limit value and a lower limit value, and the step (f) comprises steps of: (f1) outputting a positive slope of a variation of the output current braking command during a first period of time by the power control module if the power error received by the power control module within the first period of time continues to be positive; and (f2) outputting a negative slope of the variation of the output current braking command during a second period of time by the power control module if the power error received by the power control module within the second period of time continues to be negative.

7. The power control method according to claim 6, wherein the step (d) further comprises a step of: correcting the output power to a correction power by a power correction module; and the step (e) further comprises a step of: calculating the power error according to the power command and the correction power by the power error calculation module.

8. The power control method according to claim 7, wherein the power correction module corrects the output power to the correction power through multiplying the output power by a correction coefficient, and the correction coefficient is a value of the actual power measurement divided by a value of the power command.

9. The power control method according to claim 6, wherein in the steps (f1) and (f2), absolute values of the positive and negative slopes of the variations of the output current braking command output by the power control module are the same.

10. The power control method according to claim 6, wherein in the step (d), the power calculation module calculates the output power of the motor receiving a three-phase current.

* * * * *